(12) United States Patent
Eichelberger et al.

(10) Patent No.: US 6,396,148 B1
(45) Date of Patent: May 28, 2002

(54) ELECTROLESS METAL CONNECTION STRUCTURES AND METHODS

(75) Inventors: Charles W. Eichelberger, Wakefield; James E. Kohl; Michael E. Rickley, both of Reading, all of MA (US)

(73) Assignee: EPIC Technologies, Inc., Woburn, MA (US)

( * ) Notice: Subject to any disclaimer, the term of this patent is extended or adjusted under 35 U.S.C. 154(b) by 0 days.

(21) Appl. No.: 09/501,200

(22) Filed: Feb. 10, 2000

(51) Int. Cl.⁷ .................... H01L 23/48; H01L 23/52; H01L 29/40
(52) U.S. Cl. .................. 257/758; 257/750; 257/751; 257/780; 257/781
(58) Field of Search ................... 257/758, 751, 257/750, 780–784, 771, 765, 766; 438/652, 627, 653, 927, 118, 622

(56) References Cited

U.S. PATENT DOCUMENTS

| | | | | |
|---|---|---|---|---|
| 5,646,068 A | * | 7/1997 | Wilson et al. | 438/688 |
| 5,841,193 A | | 11/1998 | Eichelberger et al. | 257/723 |
| 6,111,317 A | * | 8/2000 | Okada et al. | 257/737 |
| 6,187,680 B1 | * | 2/2001 | Costrini et al. | 438/688 |

OTHER PUBLICATIONS

"EPIC CSP Assembly and Reliability Methods," James E. Kohl et al., originally published in the Proceedings of CS198, Santa Clara, California, May 1998.

"Low Cost Chip Scale Packaging and Interconnect Technology," James E. Kohl, et al., originally published in the proceedings of the Surface Mount International Conference, San Jose, California, Sep. 1997.

* cited by examiner

*Primary Examiner*—Jhihan B Clark
(74) *Attorney, Agent, or Firm*—Kevin P. Radigan, Esq.; Heslin Rothenberg Farley & Mesiti P.C.

(57) ABSTRACT

Chips first packaging structures and methods of fabrication are presented which employ electroless metallizations. An electroless barrier metal is disposed over and in electrical contact with at least one aluminum contact pad of the chips first integrated circuit. The electroless barrier metal is a first electroless metal and is a different material than the at least one aluminum contact pad. An electroless interconnect metal is disposed above and electrically contacts the electroless barrier metal. The electroless interconnect metal is a second electroless metal, which is different from the first electroless metal. As an example, the electroless barrier metal comprises electroless nickel and the electroless interconnect metal comprises electroless copper.

8 Claims, 12 Drawing Sheets fig. 1 fig. 2 fig. 3A fig. 3B fig. 3C fig. 3D fig. 3E fig. 3F fig. 3G fig. 4A fig. 4B fig. 4C fig. 4D fig. 4E fig. 4F fig. 5A fig. 5B fig. 5C fig. 6C fig. 7C

ELECTROLESS METAL CONNECTION STRUCTURES AND METHODS

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Structure and Method for Temporarily Holding Integrated Circuit Chips in Accurate Alignment," Ser. No. 09/501,176, co-filed herewith.

"Complaint, Solderable Input/Output Structures," Eichelberger et al., Ser. No. 09/501,177, co-filed herewith; and "Integrated Circuit Structures and Methods Employing a Low Modulus High Elongation Photodielectric," Ser. No. 09/502,078, co-filed herewith.

TECHNICAL FIELD

The present invention relates in general to fabricating chips first single or multichip packaging structures, and more particularly, to electroless metallization processes for making direct electrical connection to aluminum integrated circuit contact pads.

BACKGROUND OF THE INVENTION

"Chips first" packaging structures are discussed in detail in commonly assigned U.S. Pat. No. 5,841,193 by Charles W. Eichelberger entitled, "Single Chip Modules, Repairable Multichip Modules, and Methods of Fabrication Thereof," the entirety of which is hereby incorporated herein by reference. The major approaches to chips first packaging (which are described therein) are the Advance Multichip Module (AMCM) approach, and the High Density Interconnect (HDI) approach, along with its offshoots including the Plastic Encapsulated MCM. In each of these structures, the chips are covered by a layer of polymer that contains via holes down to interconnection pads on the underlying integrated circuit (IC) chips. Metallization is applied and patterned to provide an interconnect layer on the polymer above the IC chips and also to provide connection to the bond pads of the IC chips themselves.

In most, if not all, prior approaches this metallization layer is provided by means of sputtering. Sputtering possesses three advantages. First, any oxide on the aluminum bond pad can be removed by back sputtering, then without breaking vacuum, the metallization can be applied. Second, because of the energy of the sputtering, cleaning of the back sputtering, and use of adhesion promoting thin metal layers, the adhesion of the metallization to the polymer surface is very good. Third, the sputtering process does not chemically attack aluminum bond pads. The major disadvantage of sputtering processing is that it is expensive. Sputtering must be done in a very clean chamber under high vacuum conditions. Energy for sputtering is provided by elaborate high voltage power supplies using magnetron sputtering heads that require water cooling. Elaborate transfer techniques must also be used to transfer the substrate between sputter cleaning operations and past the sputtering targets.

By comparison, most printed circuit processing uses electroless metallization in which metal is deposited on a polymer surface by an auto catalytic chemical reaction. A typical sputtering machine costing one million dollars can, e.g., do sixteen 5"×5" panels in an hour. In contrast, an electroless printed circuit line costing one hundred thousand dollars can process more than 160 5"×5" panels in an hour. This gives electroless metallization techniques a cost advantage of a factor of 100. The problem with using electroless processing stems from the fact that printed circuit metallization electroless processes are very aggressive toward aluminum bond pads of integrated circuit chips. For this reason, printed circuit electroless metallization processes have not been used to apply metal to chips first structures. The present invention is directed to solving this problem.

DISCLOSURE OF THE INVENTION

In view of the above, an object of the present invention is to provide an electronic interconnect and packaging structure in which both the interconnect metallization above the chips first integrated circuit chips and the connections to the integrated circuit chips are provided by electroless plating.

Another object of the invention is to provide a method for making electrical connection to integrated circuit bond pads using an electroless plating process that plates on both the polymer above the chips and on the metal bond pads, and that does not attack the bond pad.

A further object of the invention is to provide a method for fabricating an electronic packaging structure using electroless plating processes, where polymer conditioning and adhesion promotion processes, as well as the electroless metallization process itself, do not attack aluminum bond pads.

Briefly summarized, the invention comprises in one aspect an integrated circuit structure which includes at least one integrated circuit having at least one contact pad for electrically connecting thereto. An electroless barrier metal is disposed over and in electrical contact with the at least one contact pad of the integrated circuit. The electroless barrier metal comprises a first electroless metal which is a different material than the conductive material forming the at least one contact pad of the integrated circuit. An electroless interconnect metal is disposed above and electrically connected to the electroless barrier metal over the at least one contact pad to facilitate electric connection to the integrated circuit. The electroless interconnect metal comprises a second electroless metal, wherein the second electroless metal is different from the first electroless metal comprising the electroless barrier metal.

In another aspect, an integrated circuit structure is provided which includes at least one integrated circuit having multiple contact pads for electrically connecting thereto. The multiple contact pads include at least one aluminum contact pad and at least one non-aluminum contact pad. An electroless barrier is disposed over and in electrical contact with the at least one aluminum contact pad of the integrated circuit. The electroless barrier metal can comprise electroless nickel. An electroless interconnect metal is disposed above and electrically contacts the electroless barrier metal to facilitate electrical connection to the at least one aluminum contact pad of the integrated circuit, and is disposed above and electrically contacts the at least one non-aluminum contact pad of the integrated circuit. The electroless interconnect metal comprises an electroless material that is different from the electroless nickel comprising the electroless barrier metal.

In a further aspect, a method of fabricating an integrated circuit structure is provided. The method includes: providing at least one integrated circuit having at least one contact pad exposed on a surface thereof; employing electroless processing to form an electroless barrier metal over and in electrical contact with the at least one contact pad of the at least one integrated circuit, wherein the electroless barrier metal comprises a first electroless metal, the first electroless metal comprising a different material than a conductive material forming the at least one contact pad; and employing electroless processing to form an electroless interconnect metal above and electrically contacting the electroless barrier metal to facilitate electrical connection to the at least one contact pad of the at least one integrated circuit, wherein the electroless interconnect metal comprises a second electroless metal, the second electroless metal being different from the first electroless metal comprising the electroless barrier metal.

To restate, provided herein are processing techniques for depositing electroless metal in a chips first single chip or multichip packaging structure that allows direct electroless metallization to aluminum integrated circuit contact pads, while at the same time providing a strongly adhering metal on the surface of the polymer which overlies the integrated circuit chips. Advantageously, the electroless processes described herein are more cost effective than conventional sputtering techniques. In addition, electroless interconnect as described herein allows for enhanced interconnect redistribution, stress relief and the ability to use larger solder balls and wider interconnect spacing. Also, the processes described can be performed directly on the wafer, thereby eliminating the alternative process of chip placement, filler application, lapping and transfer.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1:
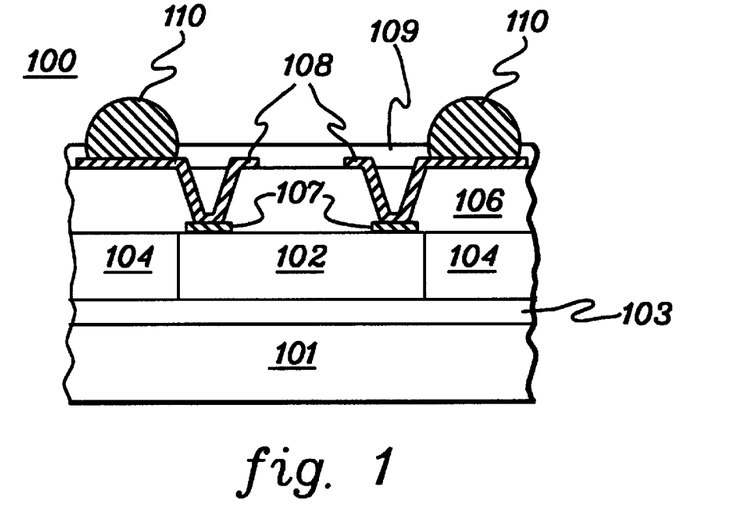
FIG. 1 is a cross-sectional elevational view of one embodiment of a single chip module to have direct connection to the integrated circuit (IC) bond pads and interconnection metallization formed by electroless processing in accordance with the principles of the present invention.
Figure 2:
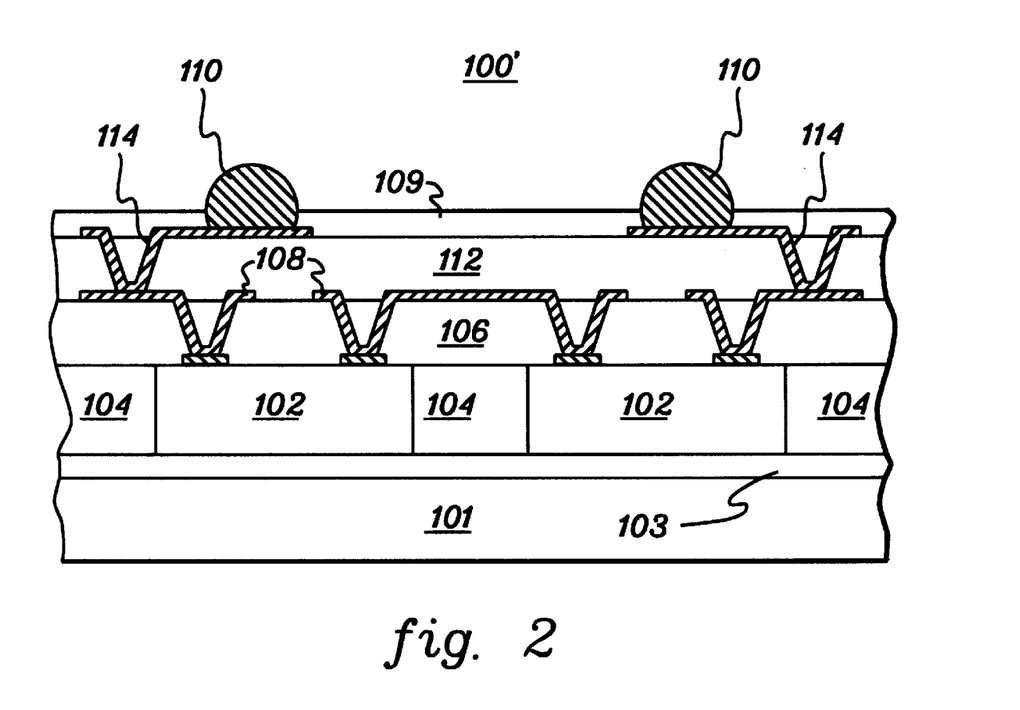
FIG. 2 is a cross-sectional elevational view of one embodiment of a multichip module to have direct connection to the IC chips and interconnect metallization formed by electroless processing in accordance with the principles of the present invention.

FIG. 1 depicts one embodiment of a chips first, single chip package, generally denoted 100, and FIG. 2 depicts a chips first multichip module 100', either of which is to be fabricated in accordance with the principles of the present invention. In FIG. 1, a single integrated circuit chip 102 is adhesively secured 103 to a substrate 101 and has filler material 104 surrounding the chip such that an upper surface of the filler material and an upper surface of the chip 102 are substantially coplanar. FIG. 2 depicts a similar structure for the multichip module embodiment. In both cases, a dielectric material, such as a polymer dielectric layer 106, covers integrated circuit chips 102 and filler 104 and contains via holes with metallization 108 thereindown to contact pads 107 on the upper surface of integrated circuit chips 102.

One embodiment of process steps which result in integrated circuit chips 102 being covered by polymer dielectric 106 with via holes down to the contact or bond pads of the integrated circuits is contained in the above-incorporated, commonly assigned U.S. Pat. No. 5,841,193. However, in this commonly assigned patent, the disclosed method for metallizing the via openings is sputtering, as is conventional in the integrated circuit packaging art. Note further that while the referenced patent discloses a method for forming via holes in a dielectric disposed above one or more integrated circuit chips, other methods for providing the dielectric layer above the integrated circuit chips, with via holes down to the integrated circuit bond pads, are available in the art and can be employed in connection with the concepts of the present invention.

More specific to this invention, provided herein are techniques for direct electroless metallization of both integrated circuit bond pads and interconnect levels above the bond pads. Various embodiments of this electroless processing are described below in connection with FIGS. 3A–7C.

Preparation for Pre-Plating of Barrier Metallization on Aluminum Bond Pads

In one aspect, aluminum integrated circuit (IC) contact pads are to be directly plated with an electroless metal coating before a polymer is applied above the integrated circuit chips. This electroless metal coating can comprise electroless nickel in one embodiment. "Pre-processing" as described herein below has the advantage that the entire contact pad or bond pad can be plated with electroless nickel, which increases the area of electroless nickel coverage and therefore may improve the reliability of the connection. In addition, if the via hole in the subsequently added dielectric layer is smaller than the integrated circuit bond pad, then additional margin is afforded against chemical attack. Finally, one other benefit is that the exposed aluminum is coated with electroless nickel, which is much less susceptible to corrosion.

Note that as used in this application, the phrase "electroless metal" refers to a type of metal formed by electroless processing as described herein. Briefly, electroless processing produces a metal structure which on close examination is distinguishable from metal structures produced by other processes, such as by sputtering. Electroless metal means that the metal has been deposited by a chemical process in which there is no external electrical current. The metal is deposited by reduction of a metal salt in solution using a chemical reducing agent. Electroless deposition is described in, for example, U.S. Pat. Nos. 5,910,340; 5,203,911; 4,467,067; 5,178,956; 4,539,044 and 4,124,399; the disclosures of which are incorporated herein by reference. Electroless nickel is believed very impervious to corrosive elements that would otherwise damage aluminum bond pads. Note that sputtered nickel is structurally distinct from and not as robust as electroless nickel.

Figure 3A:
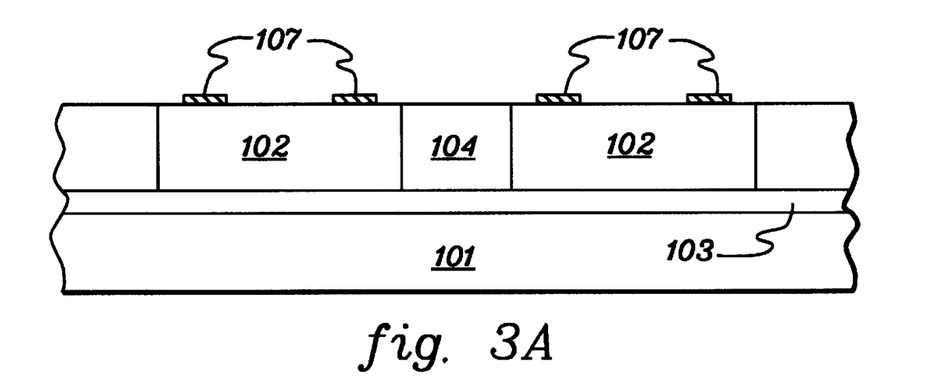
FIGS. 3A–3G are cross-sectional elevational views of process structures attained during manufacturing of a multichip module having electroless barrier metallization and electroless interconnect metallization in accordance with the principles of the present invention.

The structure of FIG. 3A is, in one embodiment, a starting point for electroless metallization processing in accordance with the principles of the present invention. In this Figure, two integrated circuit chips 102 are shown mounted on a process carrier 101 via adhesive 103 and surrounded by filler 104 such as described in the commonly assigned, incorporated U.S. Pat. No. 5,841,193. Again, however, any method which provides a similar type structure or panel could be the starting point for the invention described herein. Note, further, that the processing described herein is presented in terms of a panel with multiple integrated circuit chips. However, the same processing steps could run directly on a wafer, or individually in a single chip environment. Wafer processing is described further below in connection with FIGS. 5A–7C.

Figure 3B:
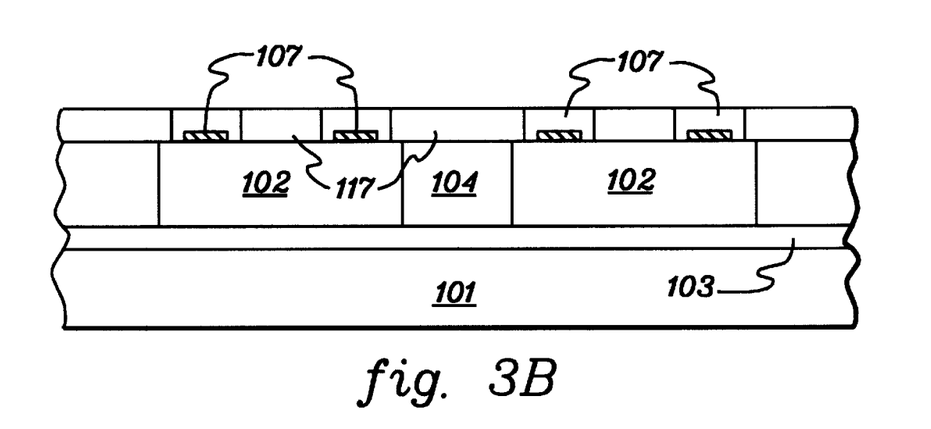

It has been found necessary to isolate integrated circuit chips so that the silicon of the chips does not make contact to any electroless plating solution. Should this happen, virtually no plating occurs on the pads connected to the power or ground bus of many integrated circuit chips. In one aspect, this isolation is provided by loosely patterning photo resist around the integrated circuit bond pads. This keeps the plating solution from contacting the silicon of the integrated circuit and also allows the plating to be defined by the pad mask on the integrated circuit chip itself and therefore reduces the requirement for precise alignment of the resist pattern and the IC chips. By way of example, Dynachem Dry Film Resist type 5038 can be used to define this pattern. This resist is available from Morton Chemical of Tustin, Calif. The dry film is applied at a temperature of 100° C. and at a speed of ½ inch per second. The dry film is exposed on a Suss MA 150 mask aligner at an energy of 50 mJ/cm$^2$ at 365 nM. Spray development in a 1% solution of potassium carbonate can be used, followed by a 1 minute rinse and a Clean Dry Air dry. FIG. 3B shows the resultant panel with dry film resist 117 applied and patterned with openings 115 fully exposing bond pads 107 of chips 102. The structure of FIG. 3B is now ready for the application of electroless barrier metal.

Aluminum Bond Pad Preparation and Nickel Deposition

The aluminum bond pad is first etched to remove the oxide from the aluminum and leave the aluminum with a micro roughened surface. A water solution of 27% ammonium fluoride, 2% ammonium phosphate, 2% hydrofluoric acid, such as BD etch, is diluted with 3 parts DI water and 1 part BD etch concentrate, and used at room temperature with agitation for a period of 3 minutes. This is followed by an immersion rinse for 30 seconds and a dip into 30% ARP 350 Zincate solution at room temperature with agitation for a period of 2 minutes. ARP 350 Zincate is an aqueous solution including 10% nickel fluoborate and 25% zinc fluoborate, which deposits a uniform thin coating of zinc on the aluminum bond pads. This is followed by a rinse for one minute with DI Water and then a dip in an electroless nickel plating solution, such as DuraPosit 90™ Nickel plating solution, operated at 90° C. for 10 minutes. DuraPosit plating solution contains 13 gm of nickel sulfate as the source of Ni (II), 39 gm of sodium hypophosphite as the reducing agent, 15 ppm lead acetate as stabilizer and 52 gm of organic and inorganic salts such as lactic acid and propionic acid for complexing nickel and preventing nickel phosphite precipitation. The pH is adjusted with potassium carbonate to 4.8. This builds a coating of electroless nickel on the exposed aluminum bond pad. The nickel deposited is approximately 1–2 microns thick. Next, the part is rinsed for 1 minute in DI Water and dried with clean dry air. BD Etch is available from Transene Co. of Rowley, Mass. ARP 350 zincate solution is available from MacDermid Inc. of Waterbury, Conn.; DuraPosit 90 nickel plating solution is available from Shipley Co., Inc. of Marlboro, Mass.

Resist Removal

Figure 3C:
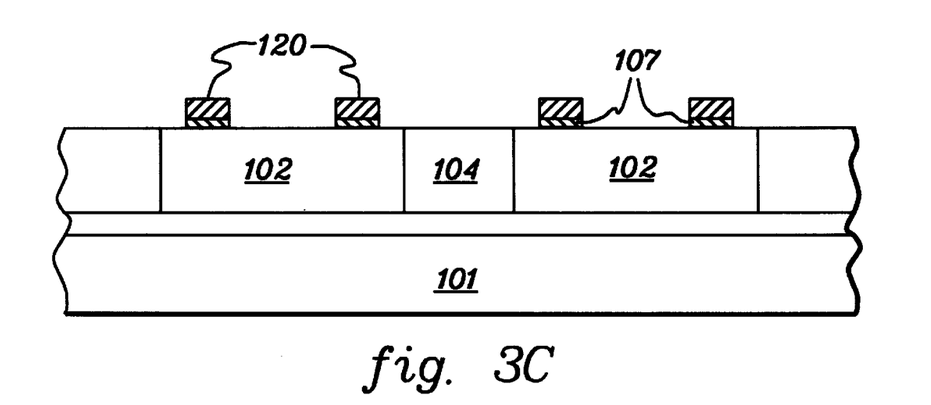

The resist can be removed in a 50% solution of Trewax stripper and DI Water at 70° C. using continuous agitation until all resist is stripped. Trewax stripper is available from Carroll Company of Garland, Tex. Following this step, the part is rinsed for 1 minute in DI Water and dried with clean dry air. FIG. 3C shows the resultant panel with the electroless nickel barrier 120 plated on aluminum bond pads 107 of integrated circuit chips 102.

Application and Patterning of Dielectric

Next, a layer of polymer dielectric is sprayed on the upper surface of the panel and soft baked. One preferred polymer dielectric is a urethane acrylate described in detail in the above-incorporated, co-filed United States patent application entitled "Low Modulus High Compliance Photo Dielectric and Layered Circuits Incorporating Same". This co-filed application also details appropriate primer layers and methods of application which could be employed in applying the polymer. The primer layers increase adhesion and improve performance in environmental testing.

The dielectric layer is preferably sprayed to a thickness of 40–60 microns. The polymer is soft baked 30 minutes at 95° C. Vias of 60 micron diameter are photo-patterned in this layer by exposing the layer to a total energy of 25 mJ/cm$^2$ at 365 nM. Next, the dielectric is developed in a dip developer for 1:20 minutes using a 1:2 mixture of proplyene glycol methyl ether and propanol. The dielectric is UV flooded with an energy of 4 Joule/cm$^2$. A 30% $CF_4/O_2$ plasma of 400 W in an LFE 1000 Barrel Etcher for 15 minutes is used to enlarge the via holes, remove polymer residue from the base of the via hole and texture the surface for improved adhesion of the metallization to the polymer surface.

Figure 3D:
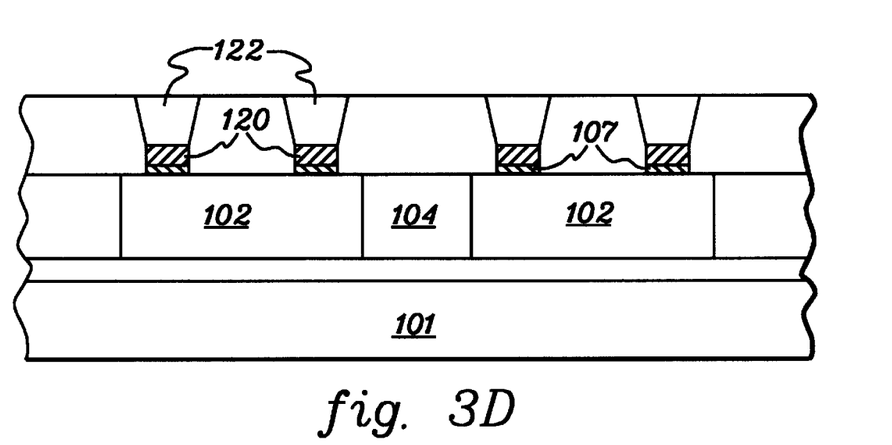

FIG. 3D shows the resultant structure with a polymer dielectric 106 applied to the top surface of the panel and via holes 122 formed in the dielectric 106 down to the electroless barrier metal 120 disposed above bond pads 107 of integrated circuit chips 102.

Catalyzation and Electroless Deposition

Electroless copper is plated to a non conductor by processes whose general steps are well known in the art. The first step is to prepare the non conducting surface with an etch which cleans the surface and also roughens the surface so that the metal has a suitable surface for mechanical keying. Next a catalyst is adsorbed to the non conducting surface from an aqueous bath. The purpose of the catalyst is to trigger the deposition of electroless copper. The electroless copper plating solution consists of a source of copper ions and a reducing agent. The reducing agent is usually formaldehyde. The reducing agent reduces the copper ions in the bath to neutral copper. The bath is auto catalytic in that the reaction is triggered by the catalyst but then the deposited copper also continues to catalyze the reaction. In this way small islands of copper start on the catalyst and grow together to form a continuous sheet of copper. Formaldehyde acts as a reducing agent only in a strongly basic solution, but copper ions precipitate as copper hydroxide in basic solutions. For this reason the copper is complexed with a molecule such as EDTA (ethylene diamine tetraacetic acid), which keeps the copper ions in solution even in a strongly basic solution. To further enhance the plating, a trace amount of a stabilizer is used to control the plating rate so that the bath doesn't run away and so that the copper deposited is reduced in stress.

Conventional catalyst systems used in the printed circuit industry use a colloidal dispersion of palladium and tin chloride. The palladium and tin chloride are absorbed to the surface of the polymer substrate. Just prior to electroless plating, the tin chloride is removed using fluoboric acid leaving palladium metal. In order to keep the metal chlorides from hydrolyzing to insoluble oxychlorides, the solution is made strongly acidic with hydrochloric acid. Conventional printed circuit catalyst systems adsorb to the polymer and catalyze the deposition of copper very reliably, but the hydrochloric acid attacks the aluminum and completely dissolves a bond pad in approximately 10 seconds, making such catalyst systems unusable for making connection to IC bond pads.

In the present invention, the catalyst system is preferably chosen so that it does not attack the aluminum IC bond pads. One such system consists of a colloidal suspension of finely divided copper in a very low concentration aqueous solution of hydrazine. The catalyst system is 1.5% by weight of copper, 0.5% by volume hydrazine and 0.2% by volume sulfuric acid. When a properly prepared substrate is dipped into the catalyst solution, the finely divided copper adsorbs to the surface of the polymer and also to the metal surfaces. Subsequently, when this catalyst contacts the electroless plating solution autocatalytic reduction of electroless copper occurs. This results in a build up of a thin layer of electroless copper in the areas where the catalyst had been adsorbed. The hydrazine in the bath keeps the finely divided copper from oxidizing. The pH of this system is approximately 8. Most importantly, the bath does not attack the aluminum of the bond pads of ICs. A commercially available system that can be used is the UMT Catalyst System available from Lea Ronal of Freeport, N.Y. Catalyzation is achieved by a dip in the UMT catalyst solution operated at 32° C. for a period of 10 minutes. Following the catalyst dip, parts are water sprayed to remove excess catalyst and then transferred immediately to the electroless plating solution.

Copper electroless plating is achieved by a dip in an electroless copper plating solution (see U.S. Pat. Nos. 4,124, 399 and 4,539,044). A suitable solution is provided by preparing a mixture containing 9 gm of copper sulfate as a source of Cu(II), 60 gm of disodium EDTA as a complexing agent, 8 gm of 37% formaldehyde, 0.1 g of sodium cyanide, and 10 gm of sodium hydroxide, with deionized water to make 1 liter of solution. The plating is accomplished by exposing the catalyzed surface to the plating solution at 50° C. for a period of 2 to 4 minutes. This is followed by a 1 minute DI Water rinse and a dip in a 20% citric acid solution operated at room temperature for a period of 1 minute. The citric acid is used for anti-tarnish. After anti-tarnishing, parts are rinsed for 1 minute in DI Water and dried with clean dry air.

A preferred plating solution can be prepared from a mixture of commercially available component solutions as follows: 300 mL of Ronadep™ 100A, 6–10 mL of Ronadep™ 100S, 8 mL of 37% queous formaldehyde and 50 mL of Ronadep™ 100B, plus DI water to make 1 liter. Ronadep 100A is a 3% Cu(II) solution with complexing agents. Ronadep 100S is a stabilizer solution containing 1% sodium cyanide. Ronadep 100B is a solution of 25 percent sodium hydroxide and 0.1% sodium cyanide.

Figure 3E:
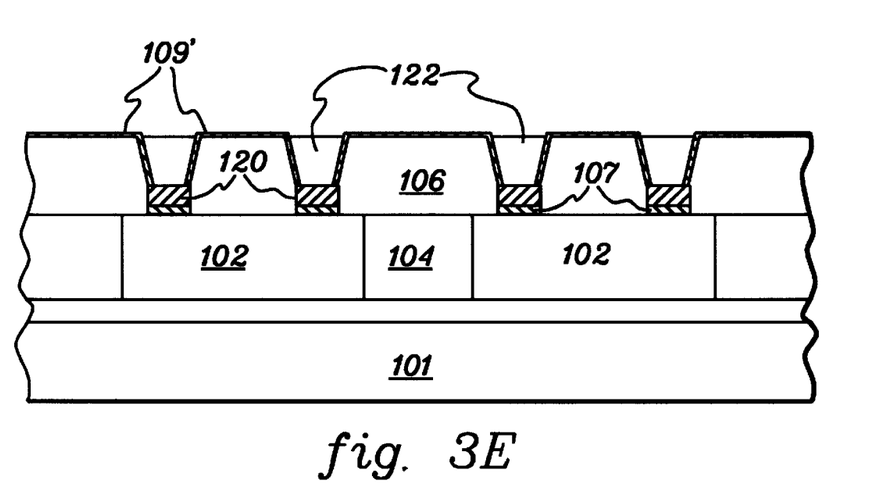

FIG. 3E depicts the resultant panel with a copper seed layer 109' deposited over polymer surface 106, down via holes 122 and making electrical contact with the electroless nickel barrier 120 which contacts aluminum bond pads 107.

Metallization Patterning

Figure 3F:
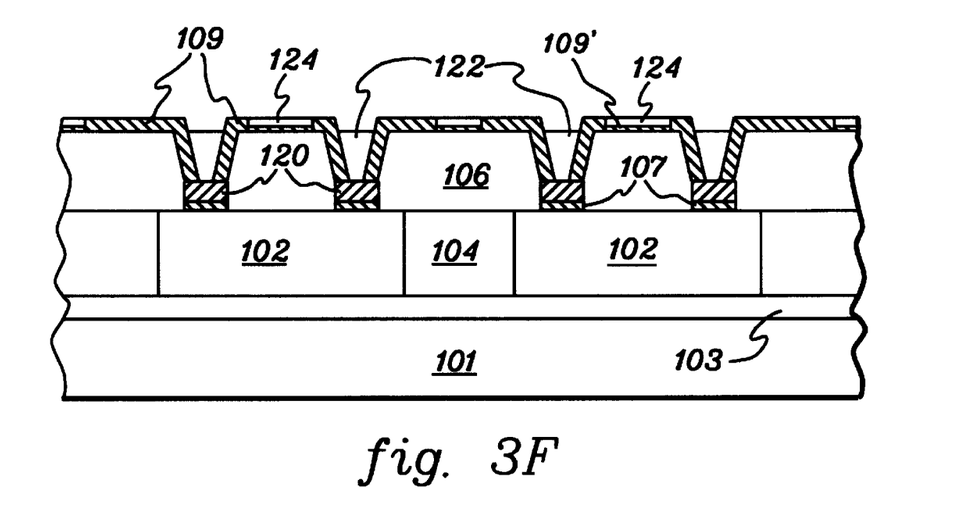

In one embodiment, plate-up patterning can be used. The seed layer 109' is covered with electro-deposited resist such as available from Shipley Corporation of Newton, Mass. The resist is patterned to form conductors from the via holes over the surface of the dielectric. The metal is then pattern plated to a thickness of roughly 10 microns. FIG. 3F depicts dielectric 106 with via holes 122, seed electroless copper 109' applied, electro-deposited resist 124 applied and patterned, and metal 1 layer 109 plated up as defined by resist 124.

Figure 3G:
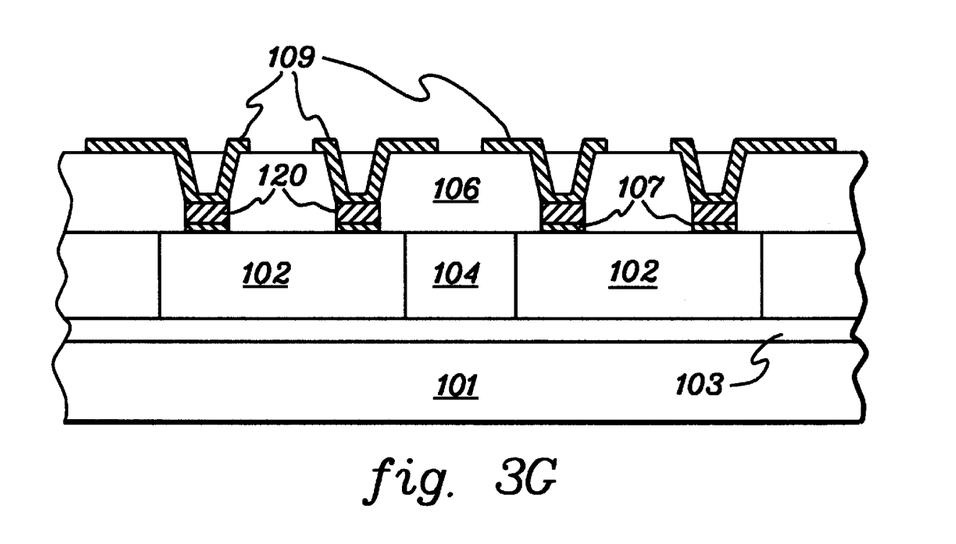

The electro-deposited resist 124 is stripped in a 25%/75% $CF_4/O_2$ plasma. The seed layer of electroless copper is etched in ammonium persulfate, which results in the completed structure of FIG. 3G showing patterned electroless metallization 109 residing atop electroless barrier metal 120 electrically contacting bond pads 107 of integrated circuit chips 102. Thus, electroless metallization has been used to make direct connection to the pads of the IC chips and at the same time provide an interconnect structure on a dielectric overlying the integrated circuit chips.

Completion of Module to Form Chip Scale Package or Multichip Module

A solder mask can then be applied and patterned to achieve the final packaging. This can be accomplished by spray coating the dielectric material as described above to, e.g., a thickness of 25 microns. The dielectric is photopatterned to leave cut-outs where solder balls 110 (FIGS. 1 & 2) are to be placed. Flux is added and solder balls are applied by techniques well known in the art. Usually, several IC chips are processed on a single panal. After sawing the panel into individual packaged modules, the CSP package of FIG. 1 is obtained. If the multichip module of FIG. 2 is desired, a second dielectric is applied and via holes are patterned. Electroless copper processing can be used to apply the seed metal layer, or the disclosed electroless copper plating mix can be used. The seed metal is again patterned as described above and the process repeated until all required metal layers have been completed. FIG. 2 shows a multichip module with two metal layers.

Process Variations

Several variations to the above-described process are worth noting. These include processing without pre-plating the barrier metal, processing copper, gold or nickel bond pads, and processing directly on a wafer.

A. Processing Without Pre-Plating the Barrier Metal

Figure 4A:
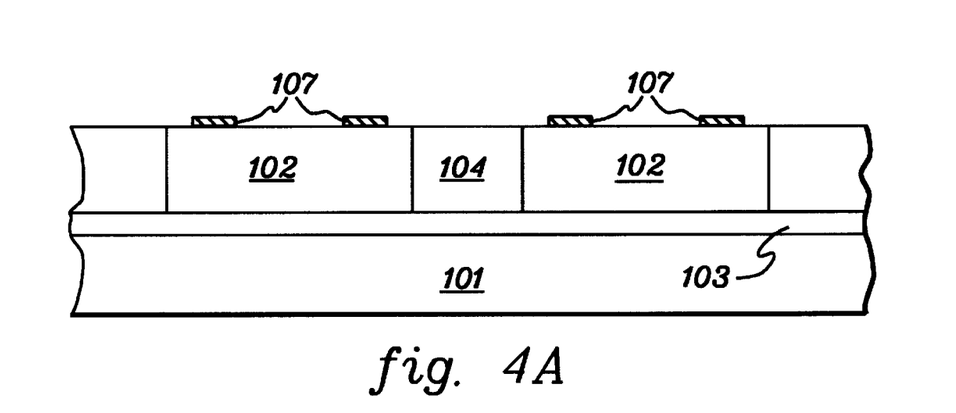
FIGS. 4A–4F are cross-sectional elevational views of process structures attained during an alternative manufacturing embodiment of a multichip module having electroless barrier metallization and electroless interconnect metallization in accordance with the principles of the present invention.
Figure 4B:
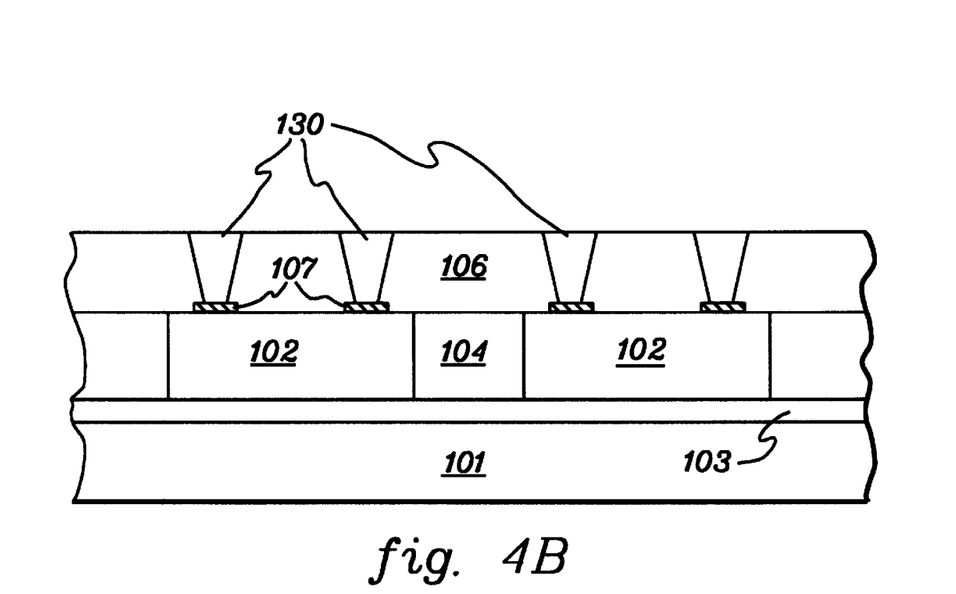
Figure 4C:
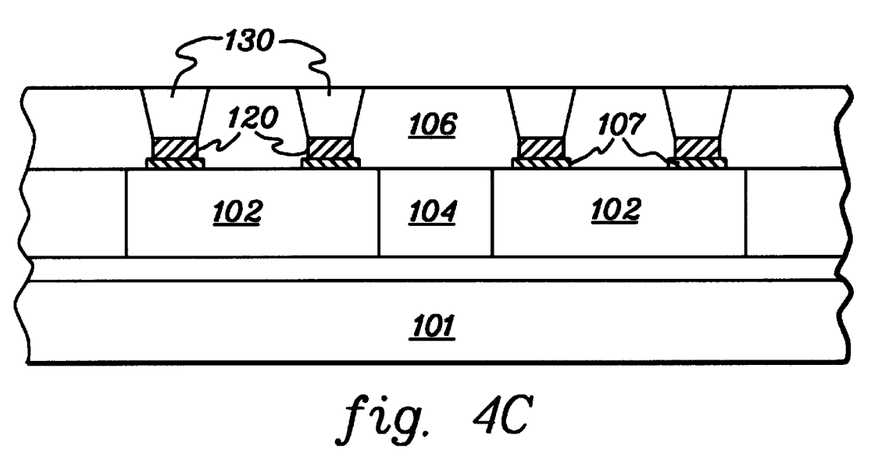
Figure 4D:
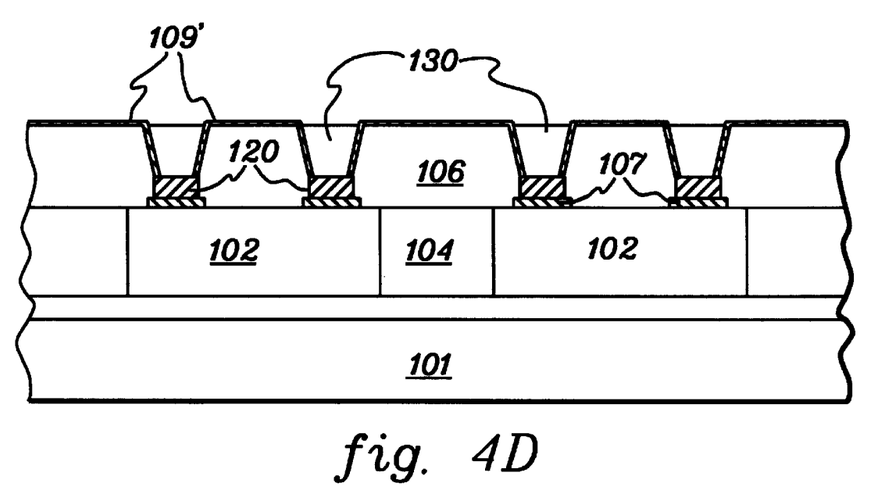

FIGS. 4A–4G depict an alternate process flow embodiment. The panel of FIG. 4A is similar to that of FIG. 3A in that multiple integrated circuit chips 102 are adhesively secured 103 to a carrier plate 101 and are surrounded by filler material 104. Chips 102 have exposed bond pads 107 on an upper surface thereof. A next step in the process is to apply a dielectric 106 and pattern the dielectric with via openings 130. This can be accomplished using similar processing to that described above. This is followed by the plating of nickel on the exposed portion of any aluminum bond pads 107. This can be carried out as described above using electroless nickel which results in the electroless barrier layer 120 in via openings 130 as shown in FIG. 4C. The electroless copper seed layer 109' is next deposited as described above and as depicted in FIG. 4D. As shown, the electroless copper seed layer covers the surface of the polymer and extends down the via holes 130 to make contact with the electroless nickel barrier 120 connected to the aluminum bond pads 107.

Figure 4E:
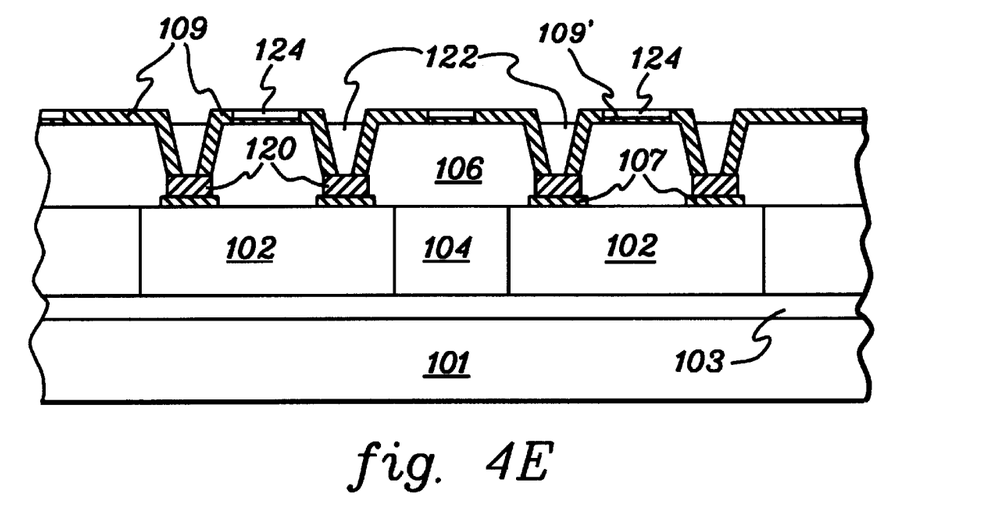

The module is completed by patterning metallization using the build-up technique described above. FIG. 4E shows the dielectric 106 with via holes 130, seed copper 109' applied, electro-deposited resist 124 applied and patterned, and metal 1 layer 109 plated up as defined by the resist and as described above in connection with the embodiment of FIGS. 3A–3G.

Figure 4F:
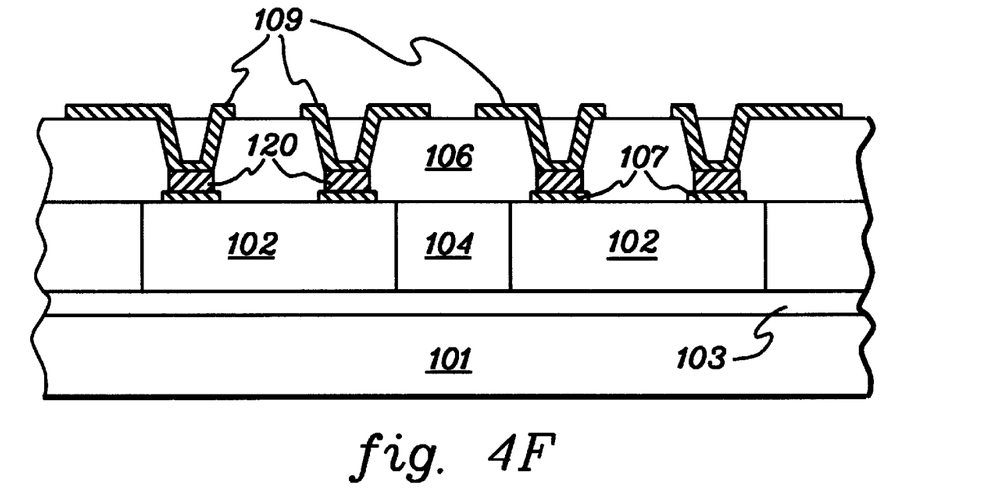

FIG. 4F shows the completed structure with patterned metallization 109. Note, again, that electroless metallization is used to make direct connection to the pads of the IC chips 102, and at the same time provide an interconnect structure 109 on a dielectric 106 overlying the IC chip. Further, the resultant structure could be supplied with solder balls, as described above. One difference between the structure of FIG. 4F and that of FIG. 3G is that the nickel barrier metal 120 in FIG. 4F does not cover the entire IC bond pad 107 as in FIG. 3G. As a further variation, the structure of FIG. 4F could be fabricated without the steps of dry film resist application and patterning and dry film resist stripping.

B. Processing Gold, Copper or Nickel Bond Pads

An advantage of the present invention is that it allows electroless metallization to be applied without damage to aluminum integrated circuit bond pads. Certain GaAs IC chips have gold pads and other chip-type components have copper or nickel pads. It is important to note that gold, copper and nickel are not as readily attacked by conventional electroless processing as is aluminum. However, the process described herein will also work with these types of bond pads. If the process is run on these pads, the electroless nickel will not deposit on the gold or copper, but will deposit on nickel bond pads. When the electroless copper step is run with the catalyst described, electroless copper will deposit on gold, copper or nickel. This is of great value when any of the three types of bond pads are combined in a module. Such an example would be a Global Positioning System (GPS) module consisting of three separate IC chips, a front end, an IF, and a processor IC. The front end is GaAs with gold bond pads, and the intermediate frequency stage and processor integrated circuit are silicon with aluminum pads.

C. Application of the Process to Wafer Processing

While the invention has been described herein above for use on chips first, single chip and/or multichip modules processed on a panel, the concepts presented can also be used directly on integrated circuit wafers. one major difference in such a process is that the electroless processing is affected by contact of the wafer with the plating fluids. Thus, in order for the process to work properly on certain pads, that electrically connect to the silicon bulk, the silicon must be prevented from contacting the various plating chemicals. This is because an electrochemical cell is set up which prevents or accelerates the normal chemical processes.

Figure 5A:
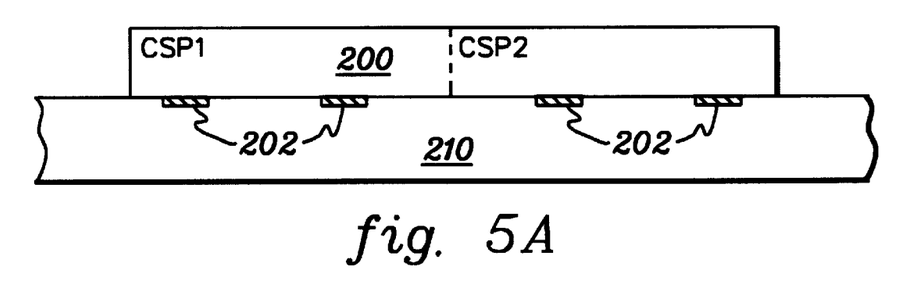
FIGS. 5A–5C are cross-sectional elevational views of process structures attained during one embodiment of processing for protecting a semiconductor wafer to undergo electroless processing in accordance with the principles of the present invention.
Figure 5B:
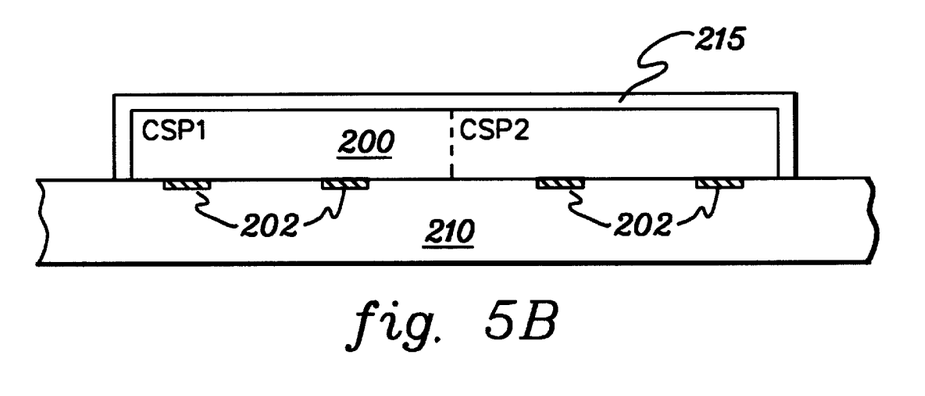
Figure 5C:
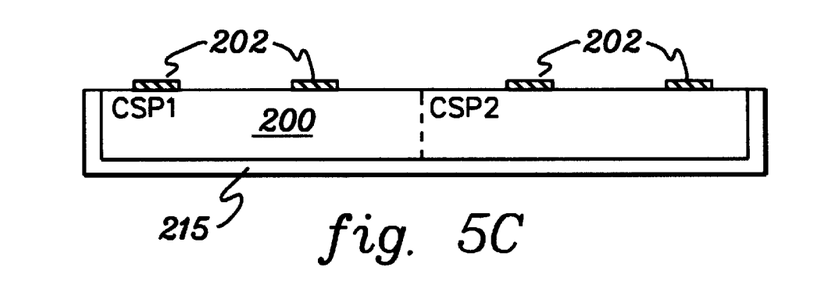

This problem can be addressed in one embodiment by coating the wafer with a polymer to prevent subsequent contact of the wafer with the plating fluids. FIGS. 5A–5C show one example of the process steps to coat a wafer 200. First, the wafer is attached to a back grinding film 210 or wafer sawing tape to protect the front surface of the wafer. Tape No. 18074 and equipment for attaching the tape is available from Semiconductor Equipment Corp. of Moorpark, Calif. After attaching the tape to the contact pad side of wafer 200, the back of the wafer is spray coated with a polymer which can with stand the subsequent processing steps. In one embodiment, 9500 CC-1 is spray coated to a thickness of 20 microns. 9500 CC-1 is available from Shipley of Newton, Mass. The 9500 is soft baked in an oven at 90° C. for 30 minutes to remove solvent. The part is then exposed to a UV flood of 365 nM at an energy of 4 Joules/$CM^2$. FIG. 5B shows the wafer 200 mounted on the film 210 with the sprayed coating 215 in place to protect the wafer from contact with the subsequent plating fluid. At this point, the tape is removed resulting in the structure of FIG. 5C. The wafer is now ready for processing and is at an equivalent point in the process as the panel shown in FIGS. 3A or 4A. The process steps are the same as the processing steps outlined above for those panels.

Figure 6A:
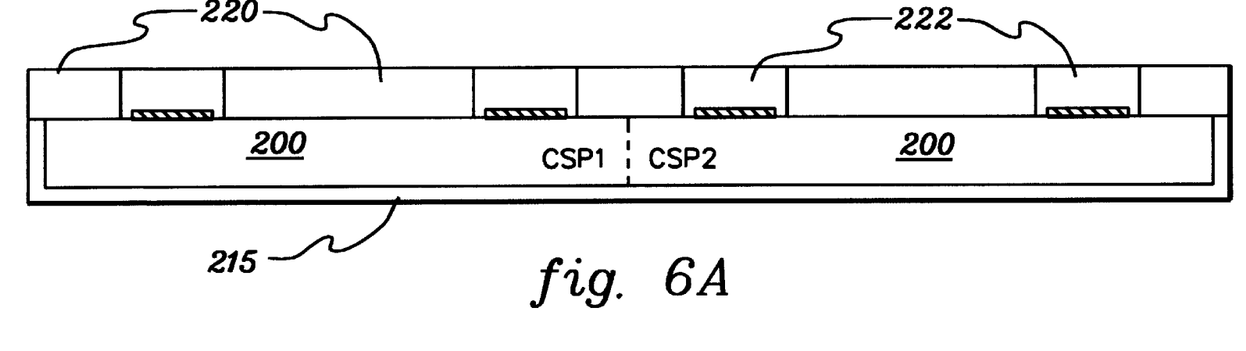
FIGS. 6A–6C are cross-sectional elevational views of process structures attained during wafer based processing using electroless barrier metallization and electroless interconnect metallization in accordance with the principles of the present invention.
Figure 6B:
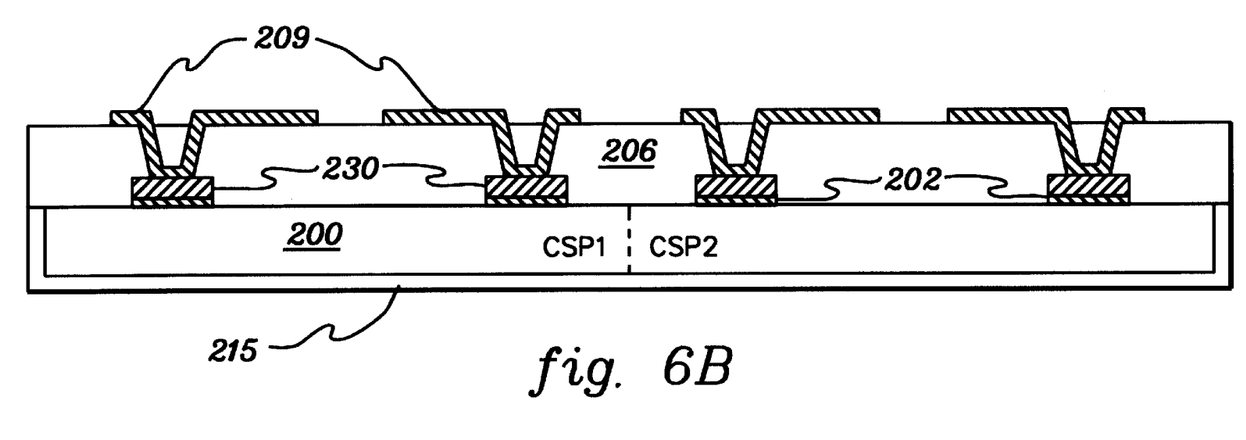
Figure 6C:
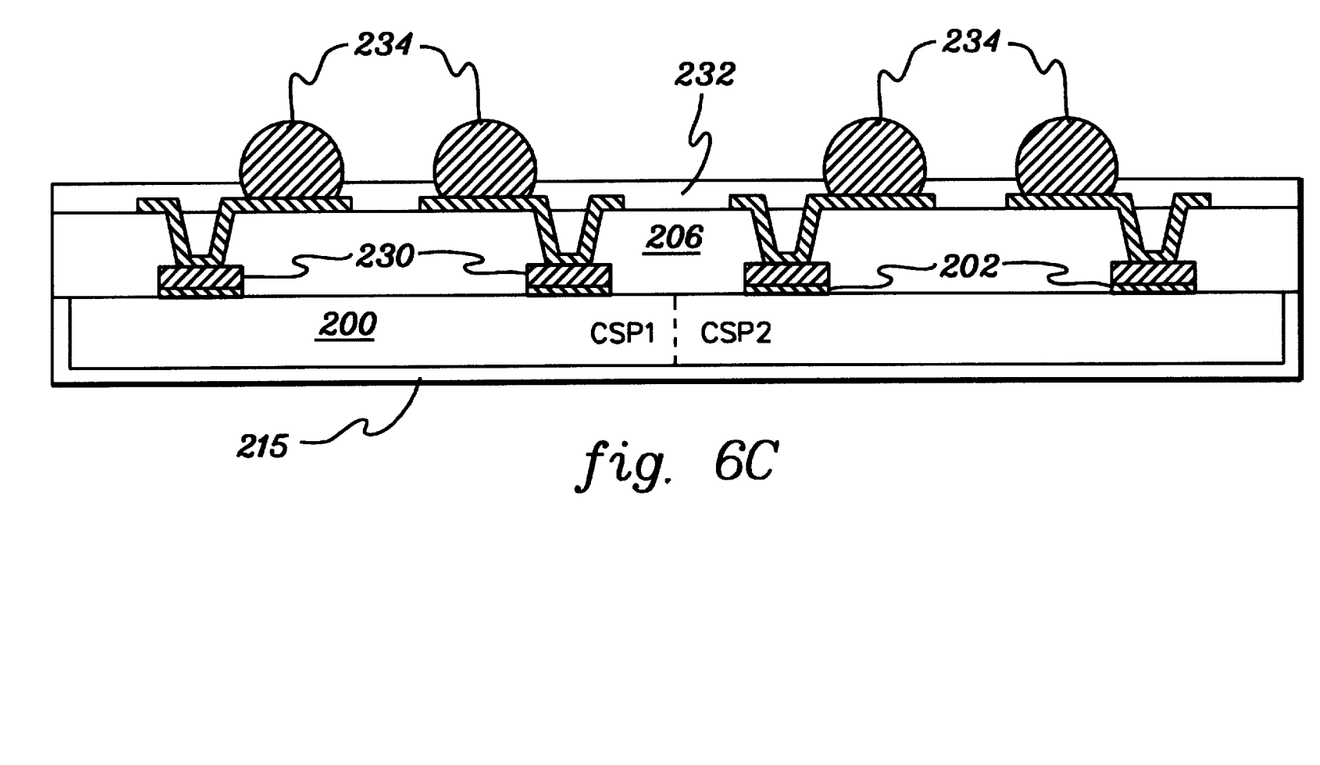

In FIGS. 6A–6C, processing is employed for the electroless nickel barrier metal to completely cover the bond pads 202. FIGS. 6A & 6B show the beginning and ending processing steps for the disclosed process where the barrier metallization is pre-plated on the aluminum bond pads. These steps are detailed in the above-described sections, including: Preparation for Pre-Plating of Barrier Metallization on Aluminum Bond Pads, Aluminum Bond Pad Preparation and Nickel Deposition, Resist Removal, Application and Patterning of Dielectric, Catalyzation and Electroless Deposition, Metallization Pattering, and Completion of Module to Form Chip Scale Package or Multichip Module. Note that FIG. 6A is equivalent to panel process step shown in FIG. 3B, and shows the wafer with polymer 206 applied and patterned. FIG. 6B is equivalent to the panel process step shown in FIG. 3G and shows the wafer with the patterned metallization 209. At this point, the structure of the subject invention has been fabricated. Electroless metallization has been used to make direct connection to the pads of the IC chips and at the same time provide an interconnect structure on a polymer overlying the IC chip. This structure can also be supplied with solder balls 234 through a patterned mask 232 as shown in FIG. 6C.

Figure 7A:
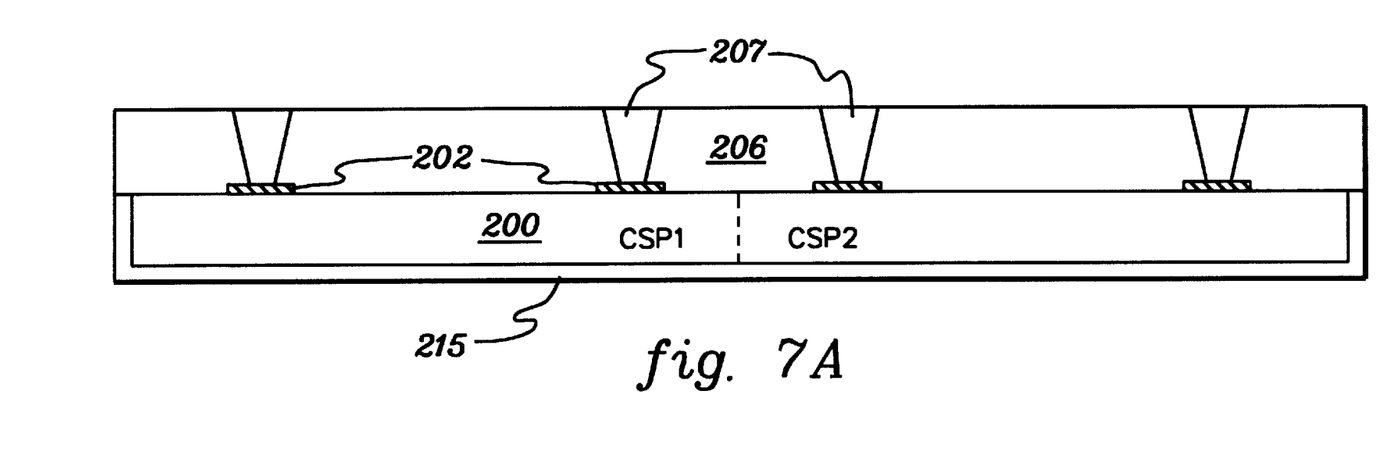
FIGS. 7A–7C are cross-sectional elevational views of process structures attained during an alternate wafer based processing approach using electroless barrier metallization and electroless interconnect metallization in accordance with the principles of the present invention.
Figure 7B:
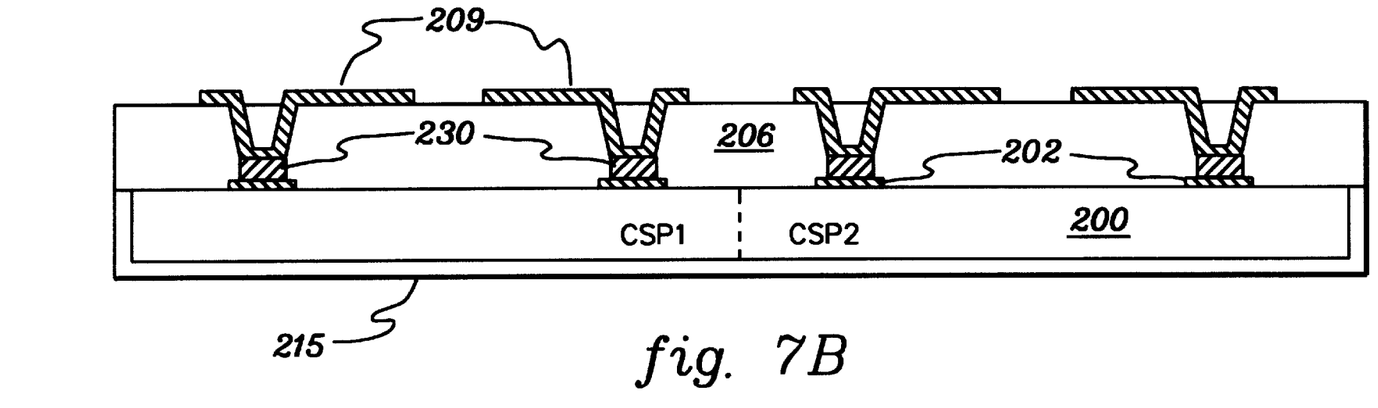
Figure 7C:
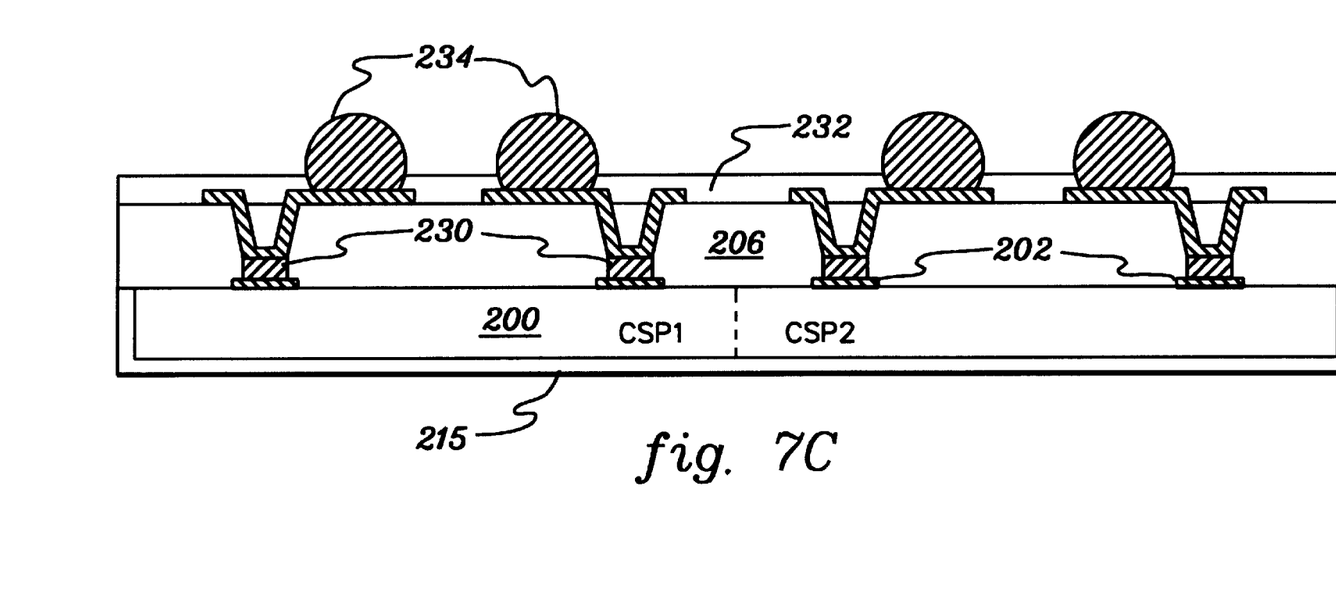

FIGS. 7A–7C show an alternate processing approach for the wafer panel of FIG. 5C. This approach, which is analogous to that described above in connection with FIGS. 4A–4F, employs electroless processing without pre-plating the barrier metal. FIG. 7A is equivalent to the panel process step shown in FIG. 4B and shows a dielectric 206 applied to wafer 200 and patterned with via holes 207 down to the integrated circuit pads 202. FIG. 7B is equivalent to the panel process step shown in FIG. 4F and shows the completed structure on a wafer with patterned metallization 209. In FIG. 7C, solder balls 234 have been added using an appropriate mask 232.

One advantage of the above-described wafer processes over conventional chip bumping processing is the same as that above in connection with the panels of FIGS. 3A–3G & 4A–4F. Namely, interconnect redistribution, stress relief, and an ability to use larger solder balls and wider interconnect spacing follows from the electroless processes described. In addition, performing the process directly on the wafer eliminates the requirement for chip placement, filler application, lapping and transfer.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An integrated circuit structure comprising:
   at least one integrated circuit having at least one contact pad for electrically connecting thereto;
   an electroless barrier metal disposed over and in electrical contact with said at least one contact pad of said at least one integrated circuit, wherein said electroless barrier metal comprises a first electroless metal, said first electroless metal comprising a different material than a conductive material forming said at least one contact pad; and
   an electroless interconnect metal disposed above and electrically contacting said electroless barrier metal over said at least one contact pad to facilitate electrical connection to said contact pad of said at least one integrated circuit, wherein said electroless interconnect metal comprises a second electroless metal, said second electroless metal being different from said first electroless metal comprising said electroless barrier metal.

2. The integrated circuit structure of claim 1, wherein said integrated circuit structure comprises one of a semiconductor wafer, an integrated circuit chip module or a multichip module having said at least one integrated circuit.

3. The integrated circuit structure of claim 1, wherein said at least one contact pad is formed of aluminum and said electroless barrier metal comprises electroless nickel.

4. The integrated circuit structure of claim 3, wherein said electroless interconnect metal comprises one of electroless copper, or electroless palladium.

5. The integrated circuit structure of claim 3, wherein said electroless nickel completely covers an upper surface of said at least one contact pad formed of aluminum.

6. An integrated circuit structure comprising:
   at least one integrated circuit having multiple contact pads for electrically connecting thereto, wherein said multiple contact pads comprise at least one aluminum contact pad and at least one non-aluminum contact pad;
   an electroless barrier metal disposed over and in electrical contact with said at least one aluminum contact pad of said integrated circuit, wherein said electroless barrier metal comprises electroless nickel; and
   an electroless interconnect metal disposed above and electrically contacting said electroless barrier layer to facilitate electrical connection to said at least one aluminum contact pad of said integrated circuit, and disposed above and electrically contacting said at least one non-aluminum contact pad of said integrated circuit, wherein said electroless interconnect metal comprises an electroless material that is different from said electroless nickel comprising said electroless barrier metal.

7. The integrated circuit structure of claim 6, wherein said electroless interconnect metal comprises electroless copper.

8. The integrated circuit structure of claim 7, wherein said at least one non-aluminum contact pad comprises at least one of a copper contact pad, a gold contact pad, or a nickel contact pad.

* * * * *